United States Patent [19]

Ogawa et al.

[11] Patent Number: 4,782,368

[45] Date of Patent: Nov. 1, 1988

[54] METHOD FOR CORRECTION FOR CHROMATIC ABERRATION AND EXPOSURE APPARATUS USING THE SAME

[75] Inventors: Kazufumi Ogawa; Masaru Sasago, both of Hirakata; Masayuki Endo, Izumi; Takeshi Ishihara, Neyagawa, all of Japan

[73] Assignee: Matsushita Electric Industrial, Co., Ltd., Osaka, Japan

[21] Appl. No.: 70,715

[22] Filed: Jul. 7, 1987

[30] Foreign Application Priority Data

Jul. 11, 1986 [JP] Japan ............................... 61-164061
Jul. 18, 1986 [JP] Japan ............................... 61-170022

[51] Int. Cl.$^4$ ............................................. G03B 27/52
[52] U.S. Cl. ........................................ 355/43; 355/53
[58] Field of Search ................... 355/43, 53, 54, 77; 356/400, 401

[56] References Cited

U.S. PATENT DOCUMENTS

| | | | |
|---|---|---|---|
| 4,402,596 | 9/1983 | Kanatani | 355/43 |
| 4,592,648 | 6/1986 | Tabarelli et al. | 355/53 X |
| 4,653,903 | 3/1987 | Torigoe et al. | 355/53 |
| 4,685,807 | 8/1987 | Picard | 356/401 |

Primary Examiner—Donald A. Griffin
Attorney, Agent, or Firm—Wenderoth, Lind and Ponack

[57] ABSTRACT

Disclosed is an exposure apparatus used in a photolithographic process in fabrication of semiconductor devices. More particularly, in the exposure apparatus using an excimer laser, the beam splitter, mirror and lens for correction for chromatic aberration are combined in the alignment optical system. Furthermore, a mirror is disposed at the opposite side of the image pickup camera of the alignment key by way of the beam splitter.

5 Claims, 3 Drawing Sheets

METHOD FOR CORRECTION FOR CHROMATIC ABERRATION AND EXPOSURE APPARATUS USING THE SAME

BACKGROUND OF THE INVENTION

This invention relates to a method for correction for chromatic aberration and an optical exposure apparatus used in fabrication of semiconductor devices or the like by using the correction method, and more particularly to a reduction-projection excimer exposure apparatus devised for achievement of ultrafine processing by photolithographic technology in fabrication of semiconductor devices.

Presently, there is already commercial reduction-projection exposure apparatus (stepper) using a superhigh pressure mercury lamp as a light source for ultrafine processing of semiconductor devices, in particular, LSI and VLSI. In conventional steppers, however, since a g-line (436 nm) or i-line (365 nm) superhigh pressure mercury lamp is used, resolution has been limited to 1.2 $\mu$m in the g-line or about 0.8 $\mu$m in the i-line. At such wavelengths, it is almost impossible to obtain a resolution of 0.5 $\mu$m which is said to be required in the future for fabrication of 4 Mbit devices DRAM (dynamic random access memory) or 16 Mbit devices DRAM.

Recently, therefore, it has been considered to develop an exposure apparatus using an excimer light source such as XeCl (308 nm), KrF (249 nm) and ArF (193 nm) having a shorter wavelength as compared with g-line mercury lamps or i-line.

However, reduction-projection exposure using an excimer laser involves the following two problems.

(1) A Problem as to the half-width value of the wavelength distribution of light emitted by the excimer laser and achromaticity of the reduction-projection lens (relation between speckle and resolution).

(2) A Problem of selection of alignment wavelength.

The former problem may be solved by providing an optical system for adjusting vertical mode while distributing the lateral mode of excimer laser light. However, in the latter problem of selection of alignment light, it is preferable to employ a method of aligning directly marks on a reticle (mask) and wafer passing a wafer through a reduction-projection lens by using light at the same wavelength as the exposure wavelength in order to enhance alignment precision (through-the-lens method, or TTL method), which is advantageous in that lens design is facilitated. Therefore, since exposure wavelength is in the ultraviolet region, alignment cannot be achieved in pattern recognition of visible light such as e-line and d-line using a conventional video camera. Yet, when aligned with a line having the same wavelength as the exposure wavelength, the resist of the alignment key part is exposed to the alignment light, and, as a result, the alignment key on the wafer is broken by one operation. Still more, in order to solve this disadvantage, if the wavelength of the alignment light deviates from the exposure wavelength, the focal position at the exposure wavelength and that of the alignment wavelength are caused to deviate due to chromatic aberration, which actually results in alignment failure.

SUMMARY OF THE INVENTION

It is hence a primary object of this invention to enable alignment by the TTL method when using light of a wavelength slightly different from the exposure wavelength in the alignment, mainly, in the excimer reduction-projection exposure.

That is, this invention provides an exposure apparatus which comprises, sequentially along the optical path, an excimer laser optical system which has a light generating source, a mirror and an integrator system for making the laser light uniform and shaping the beam, a principal optical system having a quartz-made condenser lens for illuminating a reticle, a reticle, a quartz-made reduction-projection lens, and a wafer on an XYZ stage, and an alignment optical system having a main beam splitter and an opposing mirror for taking out the alignment light, and an alignment lens, a beam splitter for alignment, an image intensifier (IIT) for picture amplification and wavelength conversion and a video camera for image processing (for example, CCD camera) arranged sequentially in the optical path perpendicular to the exposure optical path (the beam splitter for alignment is furnished with an alignment light source for illumination in the perpendicular optical path). Besides, the alignment optical system is provided with an XY driving system for illuminating an arbitrary position on the wafer. The alignment optical system and the X-Y stage on which the wafer is mounted are designed to be controlled by a computer for image processing and alignment signal processing.

At this time, meanwhile, by adjusting the interval of the main beam splitter and the opposing mirror, the focus of the light for exposure and the alignment light having a different wavelength passing through the same reduction-projection lens may be matched on the same plane.

In this invention, therefore, by using the main beam splitter, opposing mirror and the IIT for amplifying the image and converting the wavelength, it is possible to align the reticle and wafer directly by the TTL method by using an ultraviolet ray closer to the excimer laser light for exposure, so that a high precision alignment may be achieved.

Furthermore, the exposure apparatus of this invention relates to an optical apparatus for fabrication of semiconductor devices and having a reduction-projection lens, a wafer stage, a reticle stage and a light source for exposure, passing the systems for alignment light and exposure are passed in said reduction-projection lens, in which the main beam splitter and opposing mirror by way of a corrective lens are disposed in the optical path between the reticle stage and reduction-projection lens, and the alignment optical system composed of an alignment lens for magnifying the alignment mark, a camera and an alignment mark illuminating system are disposed in the direction approximately perpendicular to the exposure optical axis of the projection lens, and by adjusting said corrective lens, the focus of the alignment light returned through the reduction-projection lens from the alignment mark on the wafer and the alignment light returned from the reticle alignment mark are matched.

That is, describing the construction sequentially along the optical path, the exposure apparatus is composed of a light generation source, such as an excimer laser optical system, a mirror and an integrator system for making the laser light uniform and shaping the beam, a principal optical system comprising a quartz-made condenser lens for illuminating a reticle, a reticle, a quartz-made reduction-projection lens, and a wafer on an XYZ stage, and an alignment optical system comprising a main beam splitter, a corrective lens and an opposing mirror for taking out the alignment light, and an alignment lens, an alignment beam splitter, an image intensifier (IIT) for image amplification and wavelength conversion, a scintillation film, and a video camera for image processing (for example, CCD camera) disposed sequentially in an optical path perpendicular to the exposure optical path (the optical path of the alignment beam splitter is furnished with an alignment light source for illumination). Besides, the alignment optical system is provided with an XY system driving system in order to illuminate an arbitrary position on the wafer. And the alignment optical system and the X-Y stage on which the wafer is mounted are designed to be controlled by a computer for image processing and alignment signal processing.

According to the present invention, as described herein, the following benefits, among others, are obtained.

That is, by adjusting the corrective lens by using the main beam splitter, the corrective lens and the opposing mirror, the focus of the alignment light returning from the alignment key on the wafer through the reduction-projection lens and the alignment light returning from the reticle alignment key can be matched.

Therefore, in this invention, by using the main beam splitter, the corrective lens and the opposing mirror, and an alignment system possessing, for example, a multichannel plate for wavelength conversion or a scintilation film, the reticle and wafer can be directly aligned by the TTL method by using an ultraviolet light having a wavelength close to that of the excimer laser light for exposure, so that a high precision alignment may be achieved.

While the novel features of the invention are set forth with particularly in the appended claims, the invention, both as to organization and content, will be better understood and appreciated, along with other objects and features thereof, from the following detailed description taken in conjunction with the drawings.

DETAILED DESCRIPTION OF THE INVENTION

Example 1

Figure 1:
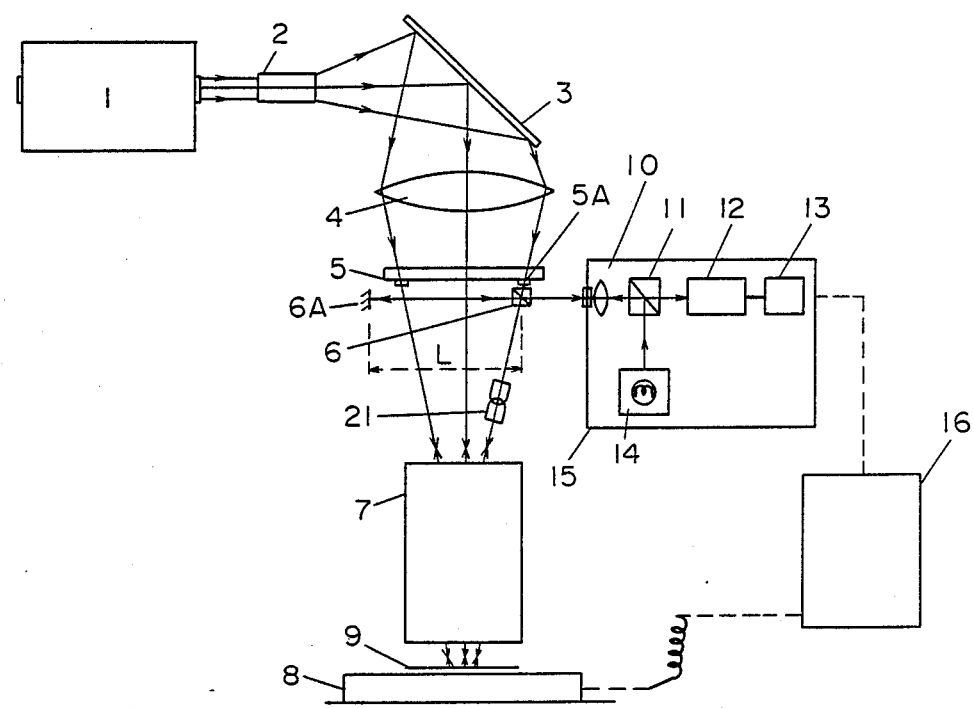
FIG. 1 is a conceptual diagram of a first embodiment to explain the excimer exposure apparatus of this invention.

Referring now to FIG. 1, a first embodiment of this invention is described below. That is, an optical system is composed of a KrF (248 nm) excimer laser light source 1, for example as a light source, an integrator 2 for shaping and making uniform the light oscillated, excited and emitted from the laser light source, a large-sized full reflection mirror 3 for deflecting the optical path perpendicularly, a quartz-made condenser lens 4 for illuminating reticle 5 and reduction lens 7, a reticle 5, a main beam splitter 6 and opposing mirror 6A for alignment, and a quartz-made reduction-projection lens 7, which is the principal optical system of the reduction-projection exposure apparatus for transferring laser light to a wafer 9 placed on an XYZ stage 8 at the image focusing point. An alignment optical system is comprised of an alignment lens 10, an alignment beam splitter 11, an IIT 12 for image processing and wavelength converting, a CCD camera 13 for image processing, and an alignment light source 14 for illuminating the alignment mark perpendicularly to the alignment beam splitter 11 (for example, light of a superhigh pressure mercury lamp being spectrally divided by a cut filter or monochromator, or laser) are disposed sequentially along an optical path on an optical axis approximately perpendicular to said main beam splitter 6 and exposure optical path and are supported on an XY driving system 15, and serve for illuminating a desired position on the wafer. The XYZ stage 8 on which the alignment optical system and wafer 9 are mounted is designed to be controlled by a control computer 16 for image processing and alignment signal processing.

The alignment optical system is described in further detail below. As the light used in the alignment illuminating system 14, for example, the light of i-line (365 nm) or j-line (313 nm) (when the reduction-projection lens 7 and excimer laser light source 1 are KrF excimer light of 248 nm) from a Xe-Hg superhigh pressure lamp through a cut filter, or HeCd laser light is used, and the main beam splitter 6 of the principal optical system is illuminated by the alignment beam splitter 11 by way of the alignment lens 10. At this time, depending on the alignment mark positions of the reticle and wafer, it is possible to illuminate arbitrarily by the alignment system XY driving system 15. The alignment illumination light can simultaneously illuminate the alignment mark 5A on the reticle 5 through the main beam splitter 6, and the alignment mark on the wafer 9 through the main beam splitter 6 and opposing mirror 6A by the light in the ultraviolet region of 313 or 325 or 365 nm, and the reflected light simultaneously returns the images of the alignment mark on the wafer 9 through the main beam splitter 6 and opposing mirror 6A and the alignment mark 5A on the reticle through the main beam splitter 6, to the alignment lens 10.

At this time, by the light of exposure wavelength (248 nm) and alignment wavelength (for example, 313 nm, 325 nm, 365 nm), a chromatic aberration occurs, and in the reduction lens as used in this invention, the chromatic aberration cannot be removed completely, so that the exposure focus and alignment focus may be deviated. Accordingly, by properly adjusting the position (L) of the opposing mirror 6A, the optical path length of the alignment light is varied, so that the alignment key on the reticle and that on the wafer may be adjusted to the equivalent focus to the light of the exposure light wavelength. For example, in FIG. 2, the image by the alignment light entering from A is reflected by the beam splitter 6 and is further reflected by the opposing mirror 6A or 6A' and enters the alignment lens 10 through main beam splitter 6. Therefore, for example, by changing the distance (L) between the opposing mirror 6A and the main beam splitter from position $L_1$ to $L_2$, it will be understood that the entire optical path length is shorted by the length of $(L_1-L_2)\times 2$. Besides, the images of the alignment marks on the wafer 9 and reticle 5 are respectively magnified by the reduction-projection lens 7 and alignment lens 10, so that a very large resoltuion may be obtained. Furthermore, the images are processed by using an image intensifier (IIT) 12 having a microchannel plate (MCP) for converting the wavelength to make visible the images which are ultraviolet rays (the visual or video processing cannot observe in the ultraviolet region), and for amplifying the video signal to enhance the S/N ratio. At this time, by setting the image wavelength usually over 500 nm, it is possible to observe in the visible region, and finally the pattern recognition processing of picture elements is effected by the CCD camera 13. As a matter of course, it is preferable that the resolution of the CCD camera be as high as possible, but it is not so effective for the image magnification or visible light.

As the image intensifier, meanwhile, a V1506 (a model name of Hamamatsu Photonics) having Cs-Te on the photoelectric plate with sensitivity of 150 to 320 nm may be used, and as an microchannel plate, for example, the F1217 (Hamamatsu Photonics) is usable.

In this embodiment, incidentally, 248 nm of KrF is used as the exposure wavelength, and HeCd laser light or 313 nm (j-line) or 365 nm (i-line) is used for the alignment light, but it is also possible to use the d-line or e-line as used in the conventional exposure apparatus as the alignment light. However, when using the e-line or d-line as alignment light, although the IIT is not needed because they are visible light, the chromatic aberration is larger than in the i-line or j-line, and it is hence necessary to significantly widen the interval L of the opposing mirror and main beam splitter. Numeral 21, by the way, denotes a magnification conversion corrective lens.

Figure 2:
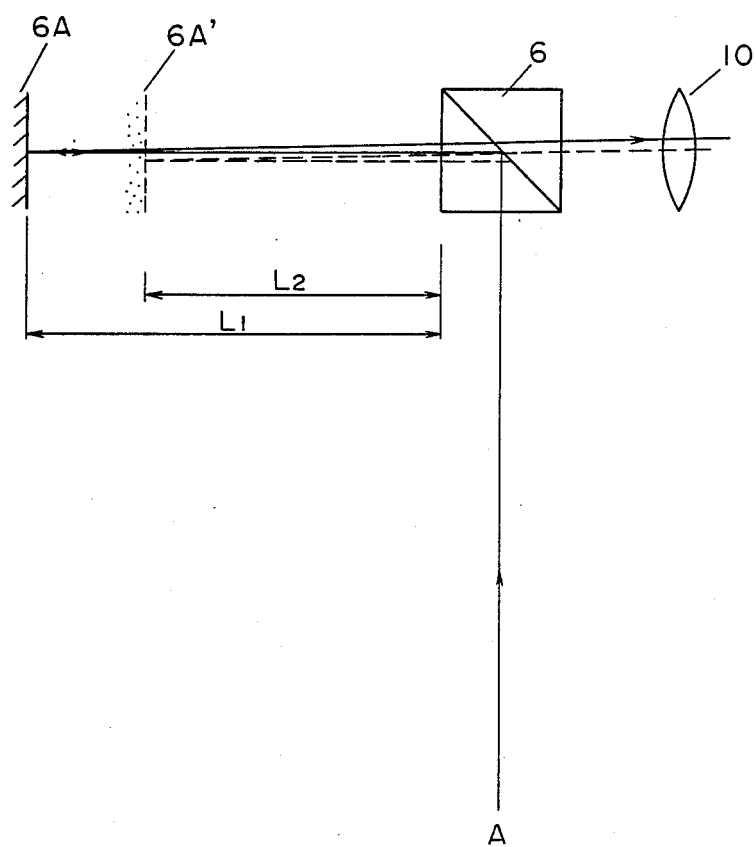
FIG. 2 is a diagram to explain the concept of a mechanism for varying the optical path length, showing an enlarged view of the main beam splitter and opposing mirror.

In the excimer laser exposure apparatus, by employing the construction of this invention, that is, by using the main beam splitter 6 and opposing mirror 6A, the off-focus due to chromatic aberration can be compensated for by varying the optical path length as shown in FIG. 2. Furthermore, by installing the ITT including the MCP on the front face of the video camera, the ultraviolet light can be converted to a visible light, and the picture may be amplified about $10^4$ times, so that a high precision alignment by the TTL method may be realized.

Accordingly, an excimer exposure apparatus having a resolution of 0.5 $\mu$m necessary for super-super LSI may be completed at a practical level. The excimer light source is not limited to KrF. It is also evident that the same effects may be obtained in a reflection reduction-projection exposure apparatus.

Example 2

Figure 3:
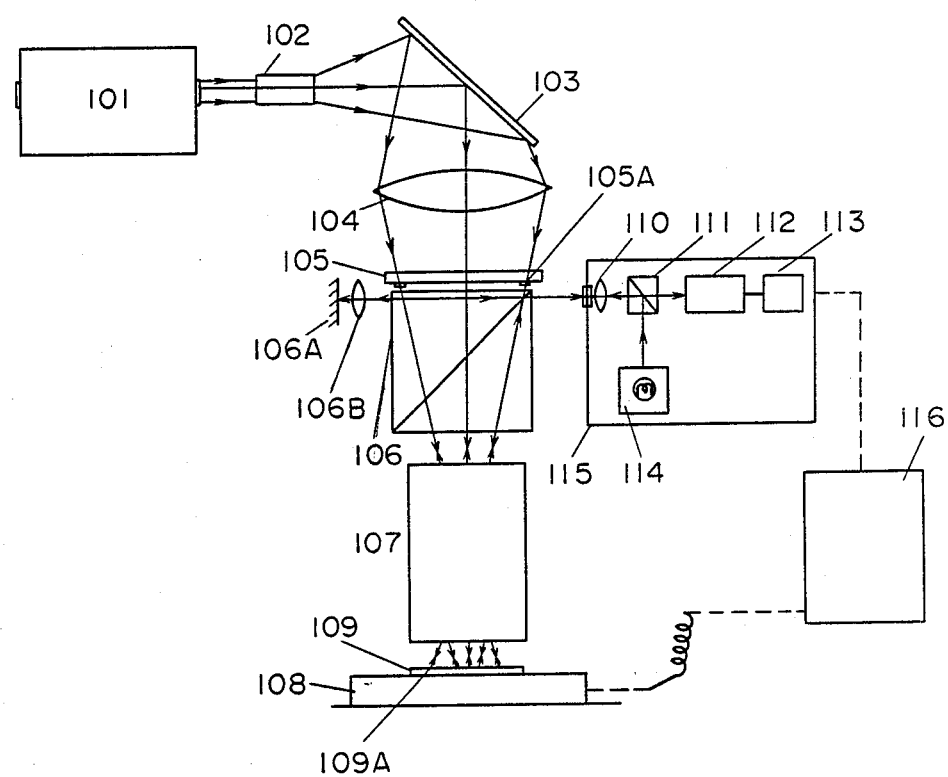
FIG. 3 is a conceptual diagram of a second embodiment to explain the excimer exposure apparatus of this invention.

A second embodiment of this invention is described below referring to FIG. 3. That is, an optical system is composed of a KrF (248 nm) excimer laser light source 101, for example as a light source, an integrator 102 for shaping and making uniform the light oscillated, excited and emitted from the laser light source, a large-sized full reflection mirror 103 for deflecting the optical path perpendicularly, a quartz-made condenser lens 104 for illuminating reticle 105 and reduction lens 107, a reticle 105, a main beam splitter 106, a corrective lens 106B and an opposing mirror 106A for alignment, and a quartz-made reduction-projection lens 7, which is the principal optical system of the reduction-projection exposure apparatus for transferring laser light to a wafer 109 placed on an XYZ stage 108 at the image focusing point. An alignment optical system is comprised of an alignment lens 110, an alignment beam splitter 111, an IIT 112 for image processing and wavelength converting, a CCD camera 113 for image processing, and an alignment light source 114 for illuminating the alignment mark perpendicularly to the alignment beam splitter 111 (for example, light of a superhigh pressure mercury lamp being spectrally divided by a cut filter or monochromator, or laser) are disposed sequentially along an optical path on an optical axis approximately perpendicular to said main beam splitter 106 and exposure optical path and are supported on an XY driving system 115, and serve for illuminating a desired position on the wafer. The XYZ stage 108 on which the alignment optical system and wafer 109 are mounted is designed to controlled by a control computer 116 for image processing and alignment signal processing.

The alignment optical system is described in further detail below. As the light used in the alignment illuminating system 114, for example, the light of i-line (365 nm) or j-line (313 nm) (when the reduction-projection lens 107 and excimer laser light source 101 are KrF excimer light of 248 nm) from a Xe-Hg superhigh pressure lamp through a cut filter, or HeCd laser light is used, and the main beam splitter 106 of the principal optical system is illuminated by the alignment beam splitter 111 by way of the alignment lens 110. At this time, depending on the alignment mark positions of the reticle and wafer, it is possible to illuminate arbitrarily by the alignment system XY driving system 115. The alignment illumination light can simultaneously illuminate the alignment mark 105A on the reticle 105 through the main beam splitter 106, and the alignment mark 109A on the wafer 109 through the main beam splitter 106, opposing mirror 106A and corrective lens 106B by the light in the ultraviolet region of 313 or 325 or 365 nm, and the reflected light simultaneously returns the images of the alignment mark 109A on the wafer 109 through the main beam splitter 106, opposing mirror 106A and corrective lens 106B and the alignment mark 105A on the reticle 105 through the main beam splitter 106, to the alignment lens 110.

At this time, by the light of exposure wavelength (248 nm) and alignment wavelength (for example, 313 nm, 325 nm, 365 nm), a chromatic aberration occurs, and in the reduction lens as used in this invention, the chromatic aberration cannot be removed completely, so that the exposure focus and alignment focus may be deviated. Accordingly, by properly adjusting the corrective lens 106B, the optical path length of the alignment light is varied, so that the alignment key on the reticle and that on the wafer may be adjusted to the equivalent focus to the light of the exposure light wavelength. Besides, the images of the alignment marks on the wafer 109 and reticle 105 are respectively magnified by the reduction-projection lens 107 and alignment lens 110, so that a very large resolution may be obtained. Furthermore, the images are processed by using an image intensifier (IIT) 112 having a microchannel plate (MCP) for converting the wavelength to make visible the images which are ultraviolet rays (the visual or video processing cannot observe in the ultraviolet region), and for amplifying the video signal to enhance the S/N ratio. At this time, by setting the image wavelength usually over 500 nm, it is possible to observe in the visible region, and finally the pattern recognition processing of picture elements is effected by the CCD camera 113. As a matter of course, it is preferable that the resolution of the CCD camera be as high as possible, but it is not so effective for the image magnification or visible light.

As the image intensifier, meanwhile, a V1506 (a model name of Hamamatsu Photonics) having Cs-Te on the photoelectric plate with a sensitivity of 150 to 320 nm may be used, and as the microchannel plate, for example, an F1217 (Hamamatsu Photonics) is usable.

In this embodiment, incidentally, 248 nm of KrF is used as the exposure wavelength, and HeCd laser light or 313 nm (j-line) or 365 nm (i-line) is used for the alignment light, but it is also possible to use the d-line or e-line as used in the conventional exposure apparatus as the alignment light. However, when using the e-line or d-line as alignment light, the IIT or scintillation film is not needed because they are visible light.

It is also evident that the alignment light may be emitted from above the reticle 106 directly, without passing through the alignment beam splitter 111.

In the excimer laser exposure apparatus, by employing the construction of this invention, that is, by using the main beam splitter 106, opposing mirror 106A and corrective lens 106B, the off-focus due to chromatic aberration can be compensated for. Furthermore, by installing the ITT including the MCP or scintillation film on the front face of the video camera, the ultraviolet light can be converted to a visible light, and the picture may be amplified, so that a high precision alignment by the TTL method may be realized.

Accordingly, an excimer exposure apparatus having a resolution of 0.5 μm necessary for super-super LSI may be completed at a practical level. The excimer light source is not limited to KrF. It is also evident that the same effects may be obtained in a reflection reduction-projection exposure apparatus.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A method for correcting for chromatic aberration in a wafer exposure apparatus by using first light of first wavelength passing through a lens system and second light of second wavelength passing through said lens system which wavelength is different from said first wavelength, comprising a step of correcting for chromatic aberration of the first light and the second light by suitably adjusting the interval between a beam splitter and an opposing mirror which are placed on at least one optical path of said first and second lights.

2. An exposure apparatus for fabrication of semiconductor devices comprising: a reduction-projection lens, a wafer stage, a reticle stage, and an excimer laser light source, positioned to pass alignment light and exposure light in said reduction-projection lens, a main beam splitter in an area corresponding to an alignment key and a mirror opposite to said main beam splitter disposed in the optical path between said reticle stage and said reduction-projection lens, and an alignment optical system composed of an alignment lens for magnifying an alignment mark, an alignment beam splitter, a camera unit, and an alignment mark illuminating system, and a drive unit for said alignment optical system disposed in a direction approximately perpendicular to the optical axis of exposure of said projection lens, whereby the focal positions of the light for exposure and alignment light can be matched by adjusting the interval between said beam splitter and said opposing mirror.

3. An exposure apparatus according to claim 2, wherein an image processing and wavelength converting unit is integrally built in said camera unit, and a multichannel plate is provided therein for wavelength conversion.

4. An exposure apparatus for fabrication of semiconductor devices comprising: a reduction-projection lens, a wafer stage, a reticle stage, and an exposure light source, positioned to pass alignment light and exposure light in said reduction-projection lens, an opposing mirror disposed by way of a main beam splitter and a correction lens in the optical path between said reticle stage and said reduction-projection lens, and an alignment optical system composed of an alignment lens for magnifying an alignment mark, a camera unit, and an alignment mark illuminating system disposed in a direction approximately perpendicular to the optical axis of exposure of said projections lens, whereby the focus of the alignment light returning from the alignment mark of said wafer through the reduction-projection lens and the alignment light returning from the reticle alignment mark can be matched by adjusting said corrective lens.

5. An exposure apparatus according to claim 4, wherein an image processing and wavelength converting unit is integrally built in said camera unit, and a multichannel plate or scintillation film is provided therein for wavelength conversion.

* * * * *